Jan. 6, 1959 J. M. KENDALL 2,867,796

ANALOG TO DIGITAL CONVERTER

Filed Sept. 23, 1953 8 Sheets-Sheet 1

INVENTOR
J. M. KENDALL

BY [signature] [signature]
ATTORNEYS

Jan. 6, 1959 J. M. KENDALL 2,867,796

ANALOG TO DIGITAL CONVERTER

Filed Sept. 23, 1953 8 Sheets-Sheet 2

INVENTOR
J. M. KENDALL

BY G. D. O'Brien
R. M. Hicks
ATTORNEYS

INVENTOR
J. M. KENDALL
BY
G. W. O'Brien
R. M. Hicks
ATTORNEYS

Jan. 6, 1959 J. M. KENDALL 2,867,796

ANALOG TO DIGITAL CONVERTER

Filed Sept. 23, 1953 8 Sheets-Sheet 4

INVENTOR
J. M. KENDALL

BY G. D. O'Brien
R. M. Hicks
ATTORNEYS

INVENTOR
J. M. KENDALL

BY G. D. O'Brien
R. M. Hicks
ATTORNEYS

Jan. 6, 1959 J. M. KENDALL 2,867,796

ANALOG TO DIGITAL CONVERTER

Filed Sept. 23, 1953 8 Sheets-Sheet 6

INVENTOR
J. M. KENDALL

BY

A. D. O'Brien
R. M. Hicks
ATTORNEYS

Jan. 6, 1959 J. M. KENDALL 2,867,796

ANALOG TO DIGITAL CONVERTER

Filed Sept. 23, 1953 8 Sheets-Sheet 7

BY

INVENTOR
J. M. KENDALL

A. D. O'Brien
R. M. Hicks
ATTORNEYS

Jan. 6, 1959 J. M. KENDALL 2,867,796

ANALOG TO DIGITAL CONVERTER

Filed Sept. 23, 1953 8 Sheets-Sheet 8

INVENTOR
J. M. KENDALL

BY G. B. O'Brien
R. M. Hicks
ATTORNEYS 2,867,796
Patented Jan. 6, 1959

2,867,796

ANALOG TO DIGITAL CONVERTER

James Madison Kendall, Coral Hills, Md.

Application September 23, 1953, Serial No. 382,017
6 Claims. (Cl. 340—347)
(Granted under Title 35, U. S. Code (1952), sec. 266)

The invention described herein may be manufactured and used by or for the Government of the United States of America for governmental purposes without the payment of any royalties thereon or therefor.

The present invention relates to an analog to a digital converter, more specifically the invention relates to a digital converter which is employed to convert the rotational position of a shaft into numerical values, the values being indicated by suitably perforating a card in a tabulator machine or by other suitable recording means. The shaft may be driven by a manually operated film record reader which is used to indicate, by the number of rotations of a feed screw shaft, positions of a stylus brought into alignment with a trace of an oscillograph recorded along the length of the film. The shaft may, also, be driven for example, by a synchro-motor or any other such device whereby measurements are to be translated into numerical values.

The aforesaid shaft of the digital converter rotates a plurality of shafts of counting devices or decade devices connected by suitable gearing to provide position indications by means of brushes rotatable with respect to multi-contact commutators in units, tens, hundreds, and thousands, it being of course, understood that the devices may be extended to provide indications in ten thousands, hundred thousands, etc. in the higher numerical values and in decimals of tenths, hundredths, thousandths, etc. in the fractional numerical values.

An object of the present invention is to provide a new and improved digital converter in which measurements are converted into numerical values in a rapid and accurate manner.

Another object is to provide a new and improved digital converter in which a mechanical counter mechanism is employed to convert a position measurement into electrical impulses indicative of such position.

Still another object is to provide a new and improved digital converter in which the mechanism is locked in exact alignment with the electrical contacts to present a correct numerical value for a given rotational position of a shaft driving the converter.

A further object is to provide a new and improved digital converter mechanism driven by a projection type film reader in which a record trace on the film may be followed with great accuracy and which converts the positions of the trace into electrical impulses indicative of numerical values and suitable for energizing the mechanism of a tabulator machine to produce a recording in the form of punched cards.

Other objects and many of the attendant advantages of this invention will be readily appreciated as the same becomes better understood by reference to the following detailed description when considered in connection with the accompanying drawings wherein.

Figure 16:
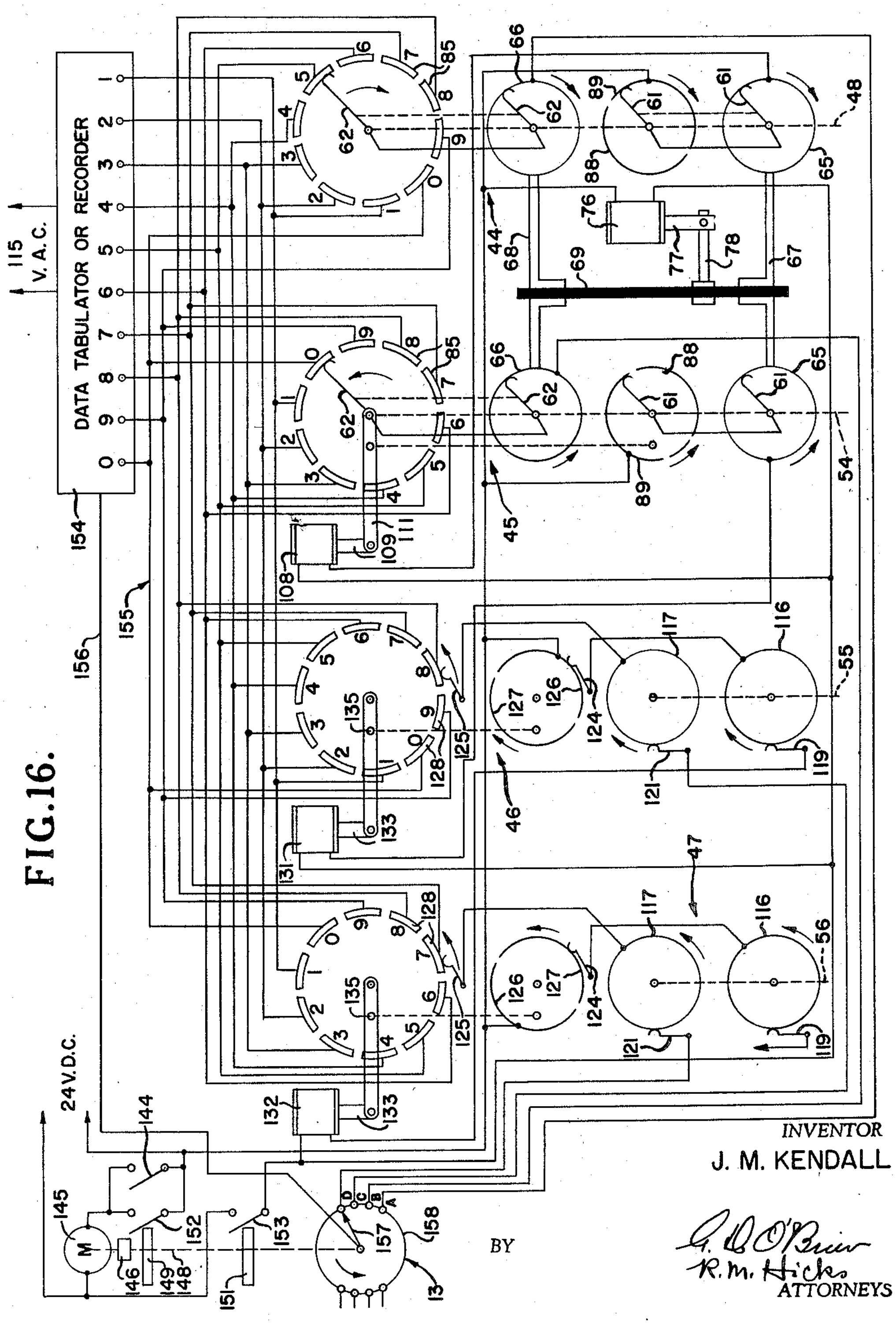
Fig. 16 is a view in diagrammatic form of the electrical circuit employed with the apparatus of the present invention.

Referring more particularly to the drawings wherein like numerals indicate like parts throughout the several views, 10 indicates generally a base member having mounted thereon a projection type film reader assembly 11, a converter assembly 12, and associated therewith is, as shown in Fig. 16, a motor-driven sequence assembly 13.

The film reader assembly 11 comprises a frame member 14 secured on base member 10 in any desired manner, frame 14 consisting of spaced vertical members 15 and 16. Horizontally mounted between members 15 and 16 is a transparent platform 17 which has mounted thereon a pair of film guide strips 18 and 19. A transparent strip 21 is fitted between guide strips 18 and 19 to provide the proper clearance for feeding a strip of film therethrough, the film being indicated at 22.

A pair of reel supporting brackets 23 and 24 are mounted on opposite sides of base member 10 and receive thereon reels 25 and 26, respectively, the film 22 being fed from reel 25 to reel 26, or vice versa, through guide strips 18 and 19, by a conventional manual feed mechanism 27. A pointer mechanism comprises a feed screw 28 mounted in bearings 29 fitted in spaced members 15 and 16, screw 28 being mounted transversely with respect to film 22. Threadedly engaging screw 28 is a nut 31 having fixed thereon a pointer 32, the pointer 32 extending longitudinally of the film and movable with nut 31 transversely of the film 22 and along the length of screw 28. Screw 28 is manually turned by means of a handle 33 mounted eccentrically on wheel 34 which is fixed on the outer end of screw 28, thus pointer or stylus 32 may be moved laterally to follow a trace recorded on film 22.

In order to follow the trace accurately a projection system is provided comprising a lamp 35 mounted beneath base member 10, a condenser lens 36 mounted between lamp 35 and film 22, a projection lens 37 mounted above film 22, and a reflector 38 mounted by bracket 39 above lens 37 and at an angle of approximately 45°. A hooded screen 41 is vertically mounted at the opposite end of member 10 for receiving the projected and enlarged image of film 22 and stylus 32. Thus by watching the screen 41, stylus 32 may be adjusted into coincidence with the trace on film 22.

Rotation of screw 28 causes the rotation of shaft 54 of the converter assembly 12 through coupling 43. Converter assembly 12 comprises a plurality of decade devices 44, 45, 46, 47 which in the present instance indicate respectively "units," "tens," "hundreds," and "thousands," it is, of course, clear that numerical values of a lower or higher order may also be indicated.

Decade device 44, used in the present instance for "units" comprises a shaft 48 mounted for rotation in bearings 49, 51 set in supports 52, 53. Decade devices 45, 46, and 47 are respectively provided with shafts 54, 55, and 56, each of which is mounted in bearings similar to those of shaft 48 and indicated at 49 and 51 in the supports 52 and 53. Mounted on shaft 48 by set screws are hubs 58 and 59 having respectively mounted thereon spring brushes 61 and 62 insulated from the hubs by insulator blocks 63 and 64. A contact ring 65 is initially spaced from brush 61 and encircles hub 58, while contact ring 66 is spaced from brush 62 and encircles hub 59. Rings 65 and 66 are respectively supported by brackets 67 and 68 on insulator plate 69 which is supported by vertically mounted leaf springs 71 on plate 72. Springs 71 yieldably maintain rings 65 and 66 in the aforementioned spaced relation. Plate 72 is mounted on base plate 73 which, in turn, is mounted on plate 74 on which are fixed supports 52 and 53. Mounted axially beneath shaft 48 and fixed on plate 73 by U-shaped bracket 75 is solenoid 76 having a movable armature 77 which is connected to insulater plate 69 through depending pin 78.

A support 79 straddles solenoid 76 and is fixed to plate 73. Clamping plate 81 is bolted to support 79 and clamps therein a sleeve or tube 83. Shaft 48 passes through tube 83 and is free to rotate therein. Mounted on the end of tube 83 adjacent brush 62 is a commutator insulator ring 84 having fixed at the periphery thereof a plurality of ten commutator contacts or segment bars 85. The ends of bars 85 are spaced from brush 62, the brush rotationally sweeping the bars in seriate order.

Clamped about commutators bars 85 and insulated therefrom by insulator strip 90 is a support 86 which supports insulator member 87 having mounted thereon a pair of semi-circular contact faces 88 and 89, the spacing therebetween being arranged substantially vertically. A disc 91 is mounted on shaft 48 between hub 58 and support 52, disc 91 having a plurality of circularly arranged conical bores 92 each of which is radially centered with one of the commutator bars 85. A conically shaped reference pin 93 is fixed on a bracket 94 mounted on plate 69 and movable therewith, pin 93 being adapted to enter one of the bores 92 when solenoid 76 is energized. In this manner, shaft 48 is turned slightly to move brushes 61 and 62 each into alignment with a single respective contact or segment when the shaft is stopped in a position where either of the brushes partially overlies two contacts or segments.

As solenoid 76 moves pin 93 into one of the bores 92 the shaft is locked against rotation and rings 65 and 66 are moved into engagement with spring brushes 61 and 62 which, in turn, are forced by the rings into engagement with their respective contacts or segments thus closing a circuit to be hereinafter more fully described. An advantage of the aforementioned brush arrangement is that the brushes are out of contact with the segments and contacts during rotation of the shaft, thus permitting the shaft to turn freely.

Shaft 48 is held against lengthwise movement by a sleeve 95 mounted on the shaft and interposed between bearing 49 and disc 91 and a sleeve 96 pinned to the shaft and engaging bearing 51.

Shaft 48 extends outwardly through support 52 and has fixedly mounted thereon a small pinion 97 and therebeyond a dial 98 having indicia thereon, namely, numerals from 0 through 9 equidistantly spaced around the periphery thereof. If desired the dial 98 may be provided with a fixed reference point (not shown).

Decade device 45 which is for "tens" is similar to device 44 with respect to the spaced relation or disengagement of the brushes 61 and 62 during rotation of shaft 54 by shaft 28 of the film reader assembly. Shaft 54 has fixed thereon a large gear 99 meshing with pinion 97 whereby shaft 48 is rotated 10 revolutions to one revolution of shaft 54. Mounted on the opposite end of shaft 54 is a small pinion 101 meshing with large gear 102 mounted on shaft 55 of decade device 46 while adjacent the opposite end of shaft 55 is mounted a pinion 103. Pinion 103 meshes with large gear 104 mounted on shaft 56 of decade device 47. Each of the gear sets 97 and 99, 101 and 102 and 103 and 104 provide a 10 to 1 gear ratio.

Mounted on shaft 54 is a dial 105 having indicia 0 through 9 inscribed on the periphery thereof and similar to dial 98, shaft 55 having a similar dial 106, and shaft 56 having a similar dial 107, all of which may be provided with fixed reference marks to assist in aligning the mechanisms 44, 45, 46 and 47.

Figure 9:
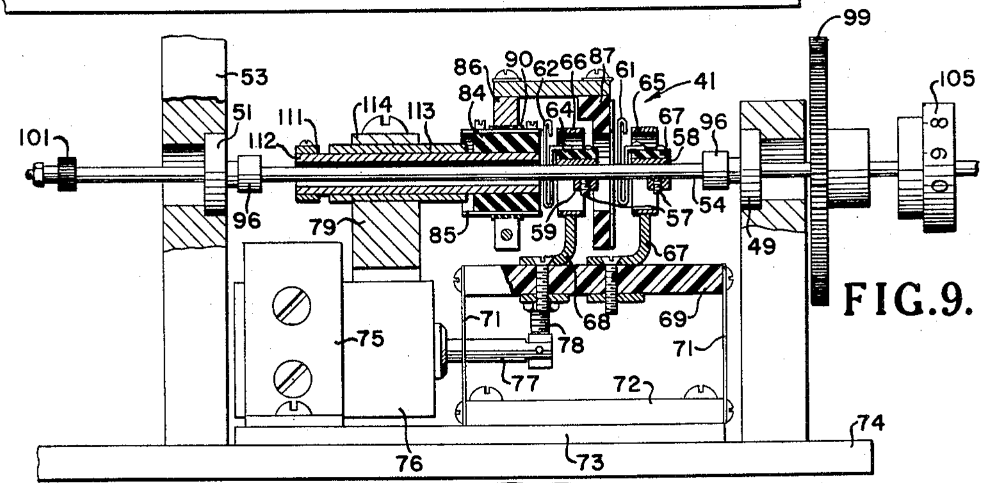
Fig. 9 is a sectional view taken along the line 9—9 of Fig. 1.
Figure 11:
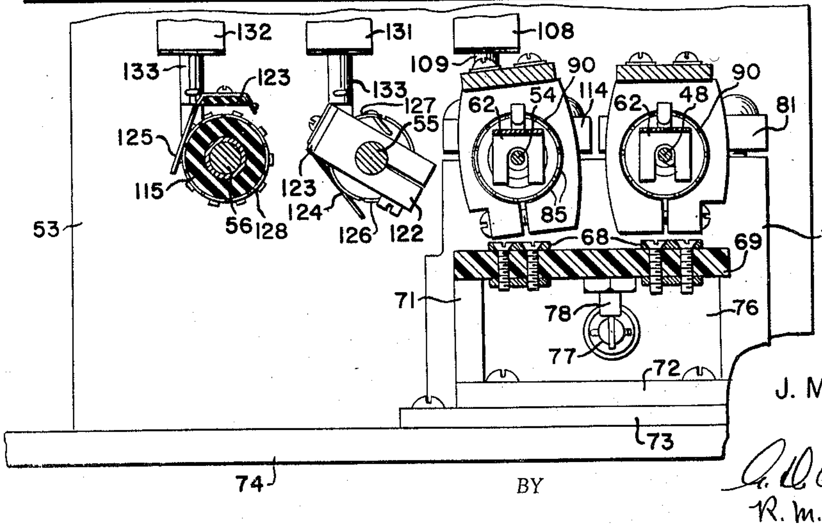
Fig. 11 is a sectional view taken along the line 11—11 of Fig. 1.

Decade device 45, as aforesaid, is largely similar to device 44, and like parts are indicated by the same reference numerals in both devices, the set screws securing hubs 58 and 59 to shaft 54 being referenced by numeral 57; see Fig. 9. In device 45 the disc 91, pin 93 and bracket 94 are replaced by a different arrangement comprising a solenoid 108 mounted on support 53 above device 45 and having an armature 109 suitably linked to a crank arm 111 fixed to the end of sleeve 112 sleeved about shaft 54. Sleeve 112 is rotatively mounted in bearing tube 113 fixedly clamped in the support 79 by clamping plate 114. Commutator insulator ring 84 of device 45 is secured to rocking sleeve 112 in the same manner that ring 84 of device 44 is secured to fixed sleeve 83, sleeve 112 being rocked approximately 15° when solenoid 108 is energized, as will be hereinafter more fully described. When sleeve 112 is rocked, commutator segments 85 rock therewith, as do insulator member 87 and its contact faces 88 and 89.

It is, of course, clear that none of the shafts 48, 54, 55 or 56 rotate during the period of energization of solenoid 75, pin 93 being fixed rotatively and engaging one of the bores 92, thus locking shaft 48 and, through the gears, the rest of the shafts of the decade devices.

Decade devices 46 and 47 are each formed in exactly the same manner, thus the same reference characters will be employed for the components making up both devices with the exception of the general designations 46 and 47, and the shafts 55 and 56. Shafts 55 and 56 have fixedly mounted thereon cylindrical insulators 115, each having a pair of collector rings 116, 117 fixed thereon. Insulator bars 118 are mounted on support 52 and extend over insulators 115 of shafts 55 and 56. A pair of spring brushes 119, 121 are mounted on each of the bars 118 and contact respectively each of the collector rings 116, 117. Clamps 122 are secured on shafts 55 and 56 and support insulator bars 123 each of which supports a pair of spring brushes 124, 125. Brushes 124 contact a pair of semi-cylindrical contact segments 126, 127 in each case, while brushes 125 contact any one of a plurality of segmental contacts 128. Contact segments 126, 127 and the plurality of contacts 128 are mounted on the cylindrical face of axially bored insulators 129, which are mounted for free rotative motion on shafts 55 and 56 respectively.

A solenoid 131 is provided for device 46, while solenoid 132 is provided for device 47. Armatures 133 of solenoids 131, 132 are connected in each case by a link 134 to insulator 129 of devices 46 and 47 by eccentrically mounted pins 135, thus to rotate contacts 126, 127 and plurality of contacts 128 approximately 15° when the respective solenoid is energized.

All of the solenoids 76, 108, 131 and 132 are provided with springs 136 for returning the armatures and associated mechanisms to the initial position when the solenoids are deenergized.

Shafts 54, 55 and 56 are fitted with bearings 49 and 51 mounted respectively in supports 52 and 53 in the manner of shaft 48. The shafts are also provided with means for preventing endwise motion thereof such as sleeves 95 and 96.

Figure 1:
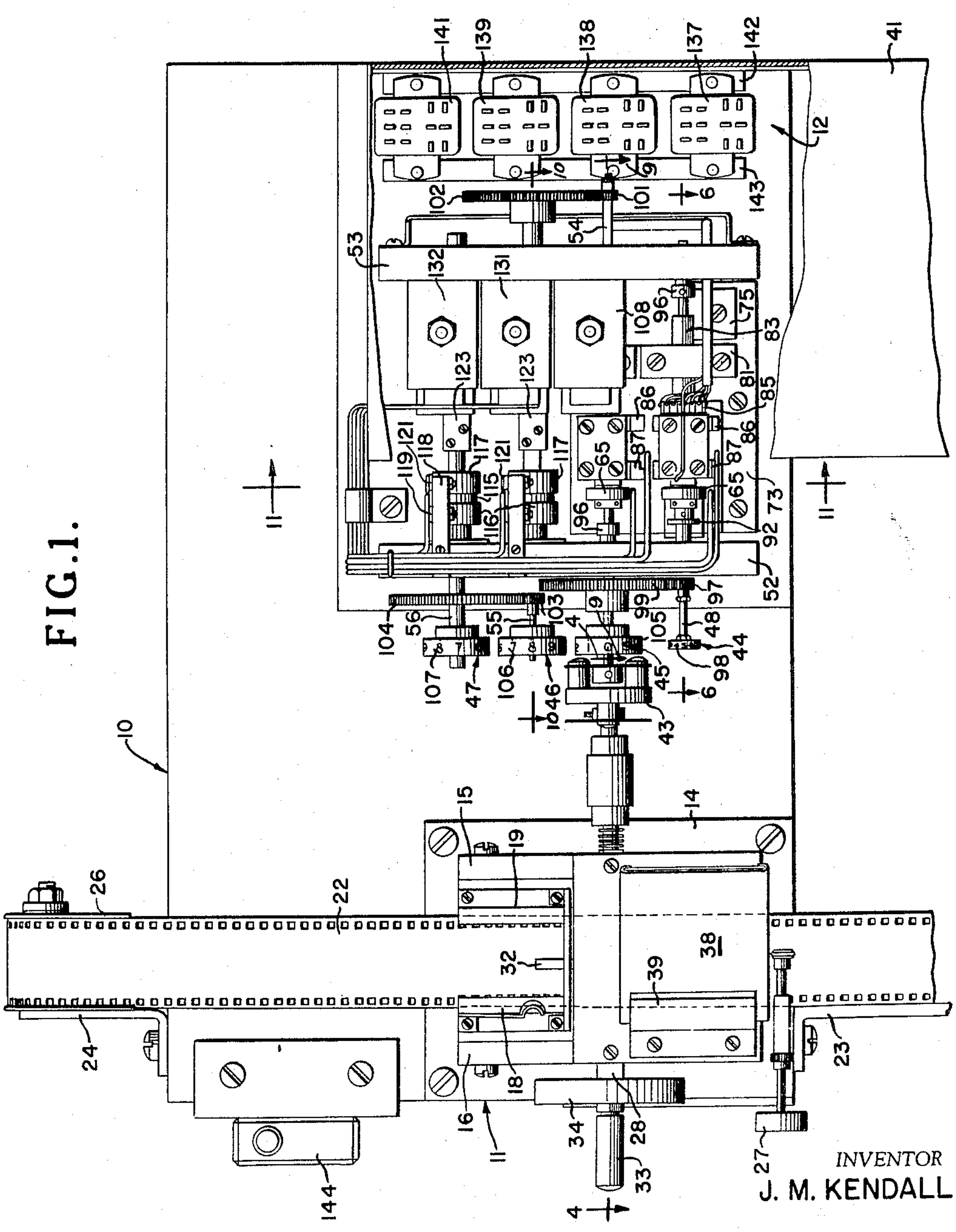
Fig. 1 is a top plan view of the device of the present invention.
Figures 2, 10:
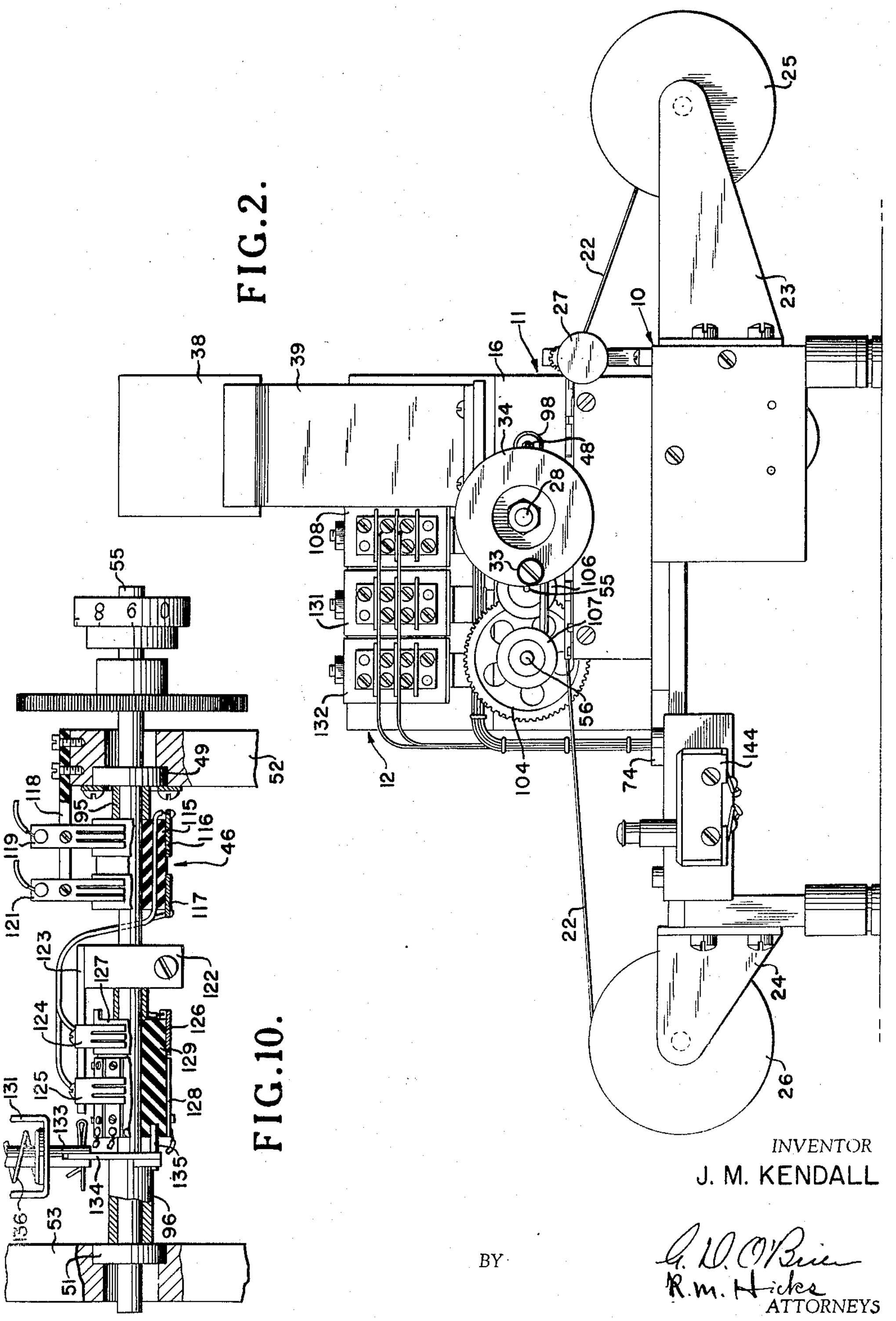
Fig. 2 is an end elevation thereof.
Fig. 10 is a sectional view taken along the line 10—10 of Fig. 1.
Figures 3, 7, 8:
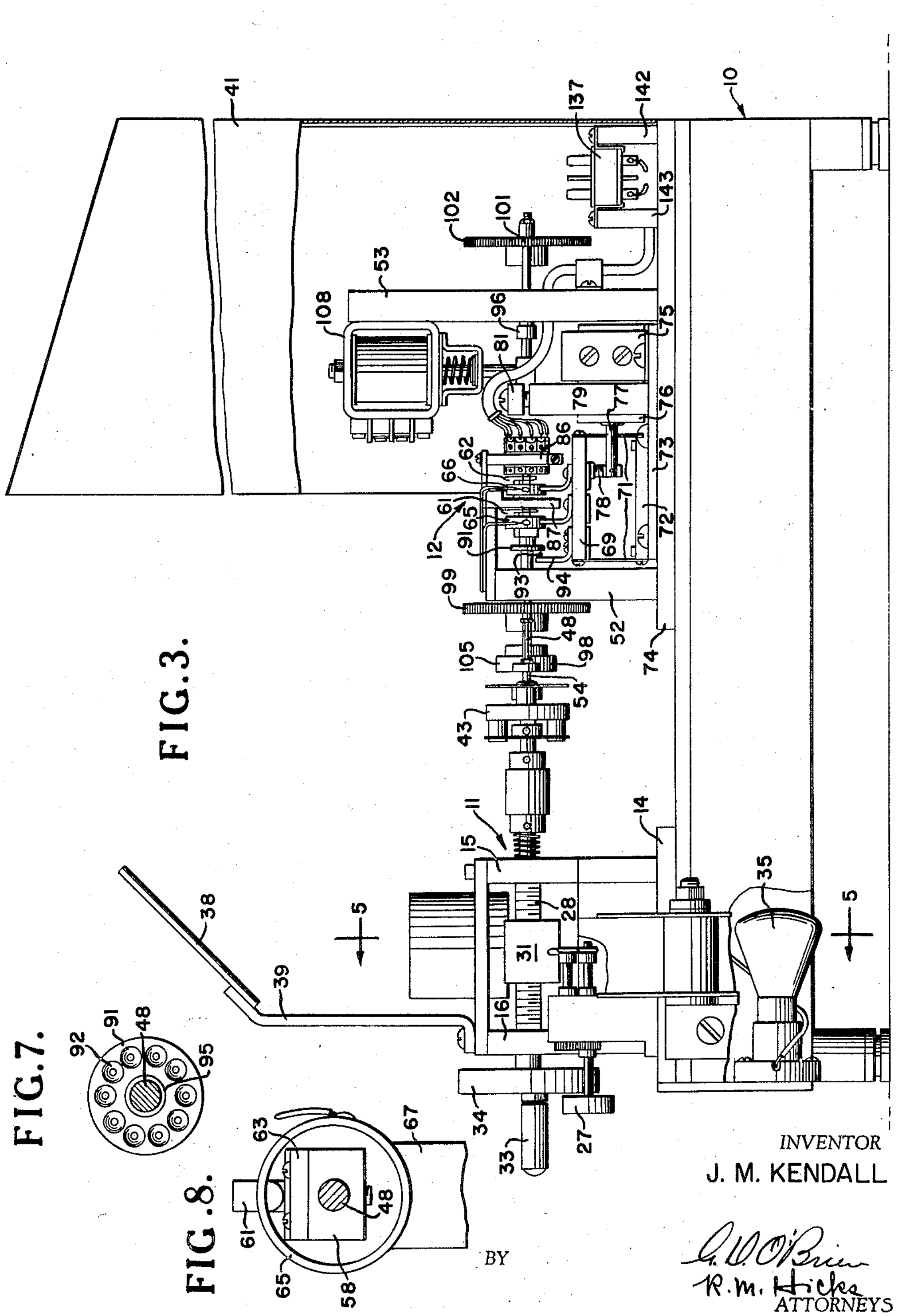
Fig. 3 is a side elevation thereof.
Fig. 7 is a sectional view taken along the line 7—7 of Fig. 6.
Fig. 8 is a sectional view taken along the line 8—8 of Fig. 6.
Figure 4:
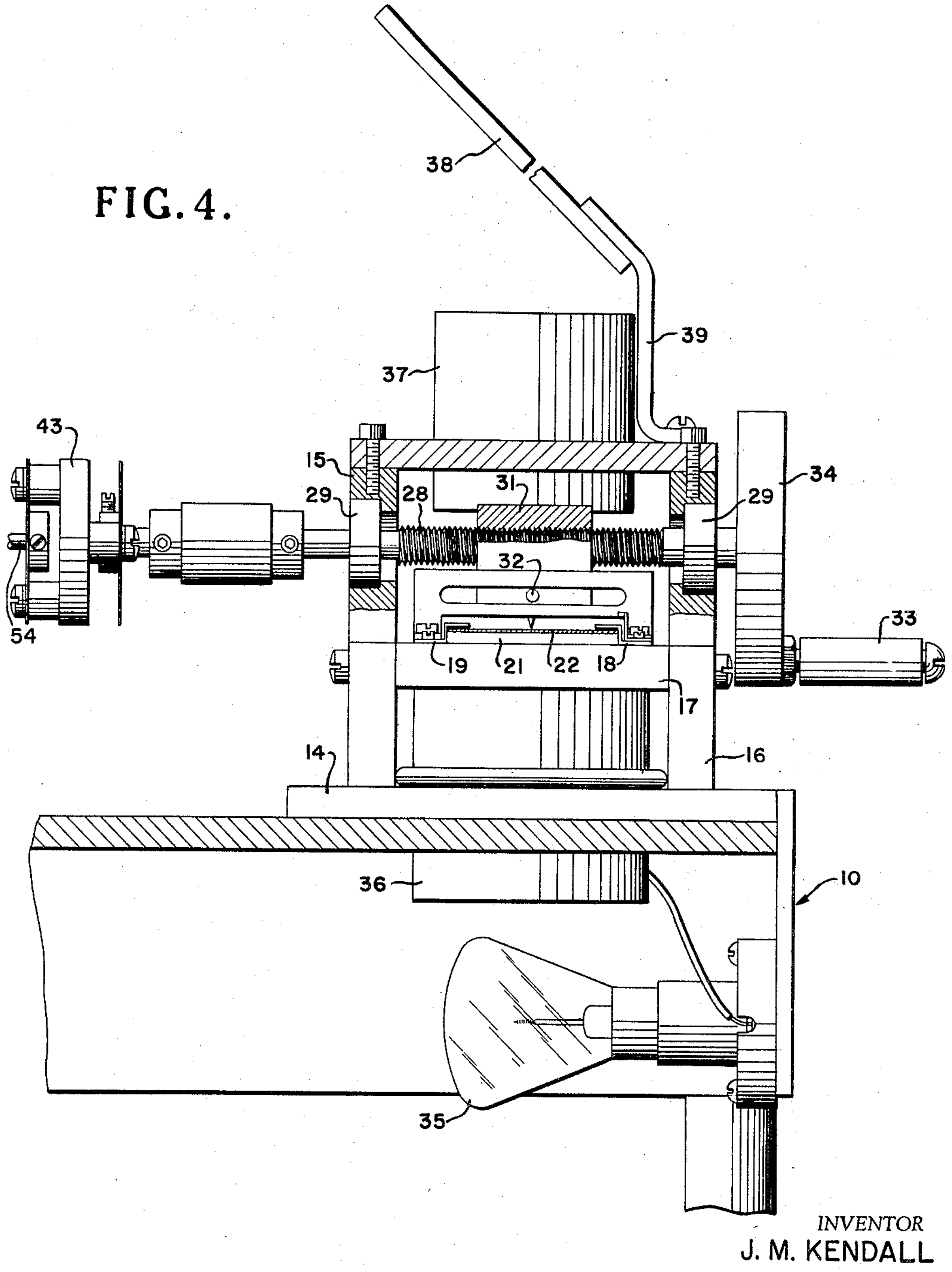
Fig. 4 is a sectional view taken along the line 4—4 of Fig. 1.
Figure 5:
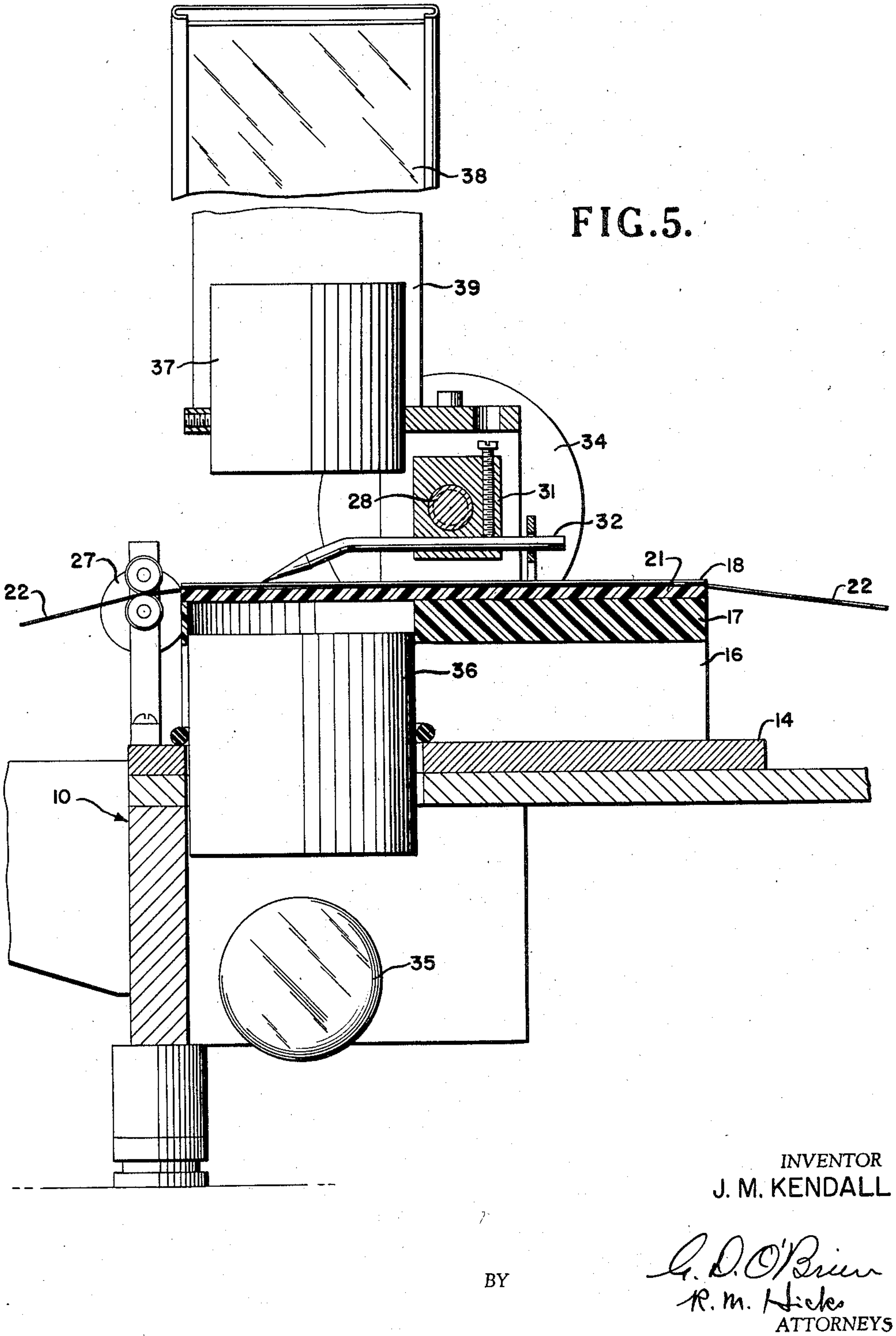
Fig. 5 is a sectional view taken along the line 5—5 of Fig. 3.
Figure 6:
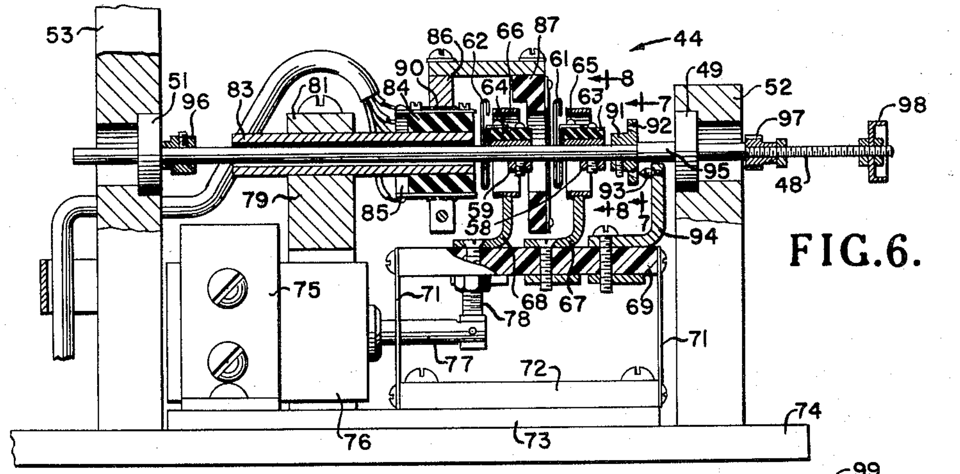
Fig. 6 is a sectional view taken along the line 6—6 of Fig. 1.

A plurality of multicontact plugs 137, 138, 139 and 141 are mounted on supporting strips 142, 143 secured to plate 74; Figs. 1 and 3. Plugs 137, 138, 139 and 141 have connected to the contacts thereof a plurality of conductors leading from the various elements of the aforedescribed apparatus as will be hereinafter more fully described.

A push-button switch 144, Figs. 1 and 16, is mounted in a convenient location on base member 10 adjacent the reader assembly 11 whereby the operation of the digital converter 12 may be initiated after pointer 32 has been moved into a desired position with respect to a trace on film 22.

In order to continue the operation of the converter mechanism through a complete cycle, the motor driven sequence device 13, Fig. 16, is provided. An electrically driven motor 145 drives, through reduction gearing 146, a shaft 148 having mounted thereon a pair of camming means 149, 151. Camming means 149, 151 release motor switch 152 and solenoid switch 153, respectively into energizing position for the greater part of a full cycle or revolution, when the operation of the sequence device 13 is initiated by push-button switch 144, the camming means 149, 151 opening the motor and solenoid circuits at the end of the cycle.

Referring more particularly to Fig. 16 wherein is shown a diagram of the electrical circuit employed with the present invention, a data tabulator is indicated at 154 and has connections 1, 2, 3, 4, 5, 6, 7, 8, 9, 0 which are numbered the same as the segments of commutators 85 and 128 of the digital converter devices 44, 45, 46 and 47. A plurality of conductors indicated generally at 155 interconnect the individual segments 1, 2, 3, 4, 5, 6, 7, 8, 9, 0 of each of the devices 44, 45, 46, and 47 with the respective connectors of tabulator 154 and having the same numbers. The circuit for providing tabulator 154 with the desired information comprises 115 v. A. C. power source through tabulator 154, one side of the circuit following conductor 156 to rotating brush 157 for selector switch 158 of sequence assembly 13 which is provided with contacts A, B, C and D respectively connected to contact rings 66 of devices 44 and 45 and brushes 121 of devices 46 and 47. In this manner when brush 157 engages contact A a circuit is completed through ring 66 of device 44, through brush 62, through one of the segments of commutator 85, for example contact "5" thereof as shown in Fig. 16 and thence through one of the conductors 155 to connection "5" of tabulator 154 thus to energize an electromagnet or solenoid (not shown) to punch a card in a manner to provide the "units" portion of a member indicative of a specific position of the stylus or pointer 32 of reader 11. It is, of course, understood that the electromagnet or other device for punching the card is interposed between connector "5" and the other side of the source of power. It is also to be understood that while a card punching apparatus has been described, any device capable of transcribing the desired information may be used such, for example, as an electric typewriter.

As brush 157 rotates in the direction of the arrow, contact A is disengaged and contact B is engaged, thus closing a circuit through ring 66 of device 45, through brush 62 and one of the segments of armature 85, in this case the "0" segment, thence through one of the conductors 155 to connection "0" of tabulator 154 thus to energize another electromagnet therein to punch the card in a manner to provide the "tens" portion of the number indicative of the position of the stylus 32.

As the brush 157 continues to rotate, contact B is disengaged and contact C is engaged thus energizing a circuit to brush 121 of device 46, to ring 117, to brush 125, to one of the segments of commutator 128, in this case segment "8," through one of the conductors 155 to connector "8" of tabulator 154 and energizing means therein to punch the "hundreds" portion of the number indicative of the position of stylus 32.

Brush 157 continues to rotate disengaging contact C and engaging contact D thus energizing a circuit through device 47 in the same manner as the circuit through device 46. On this occasion segment "7" of commutator 128 is engaged by brush 125 of device 47, thus energizing, through connector "7" of tabulator 154 the means for punching the "thousands" portion of the number indicative of the position of stylus 32.

In the foregoing manner the precise position of the stylus 32 is recorded on a punch card or the numerical values may be typed out by an electric typewriter, as aforesaid, the numerical value being "7,805" according to the foregoing positions of the devices 44, 45, 46 and 47, and being indicative, according to the present invention, of the position of the stylus with respect to one side of the film. In effect the film is divided, for the sake of such measurement, into 10,000 parts across the width thereof, thus the position of the stylus may be recorded with great accuracy.

Solenoid switch 153 is closed by cam means 151 on shaft 148 driven by motor 145, as aforesaid, which energizes the solenoid circuit of the present apparatus comprising solenoids 76, 108, 131 and 132. Solenoid 76 is energized, on closing of the solenoid circuit to move rings 65 and 66 of devices 44 and 45 into engagement with brushes 61 and 62 with sufficient force to spring the brushes 62 into engagement with one segment of segment bars 85, and brush 61 into engagement with one of the contact faces 88, 89. The brushes 61 and 62 of decade devices 44 and 46 rotate freely, as aforesaid, without engagement with the contacts or segments during rotation of the shafts while the stylus 32 is being brought into alignment with the trace on film 22, thus reducing the torque required to turn the mechanism. Solenoid 76 also operates the locating and locking pin 93, as aforesaid.

Figure 12:
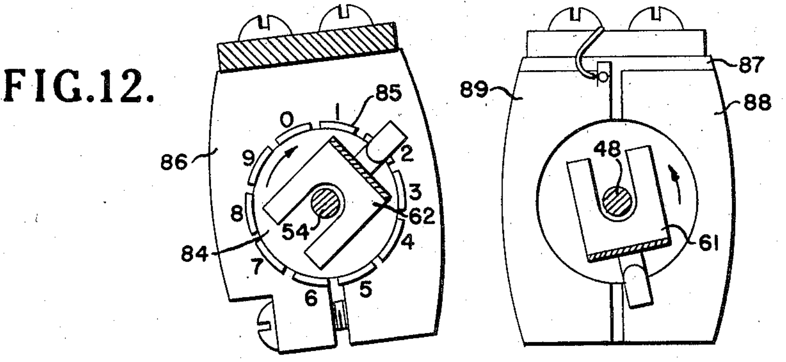
Figs. 12 and 13 are detail sectional views showing the two positions of the rotatably shiftable commutator contacts and the energizing contacts therefor of two of the decade devices.
Figure 13:
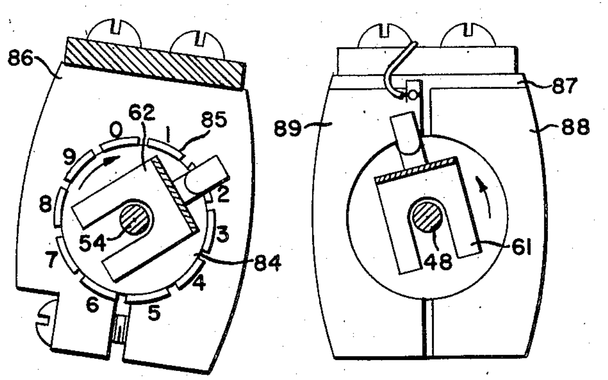
Figures 14, 15:
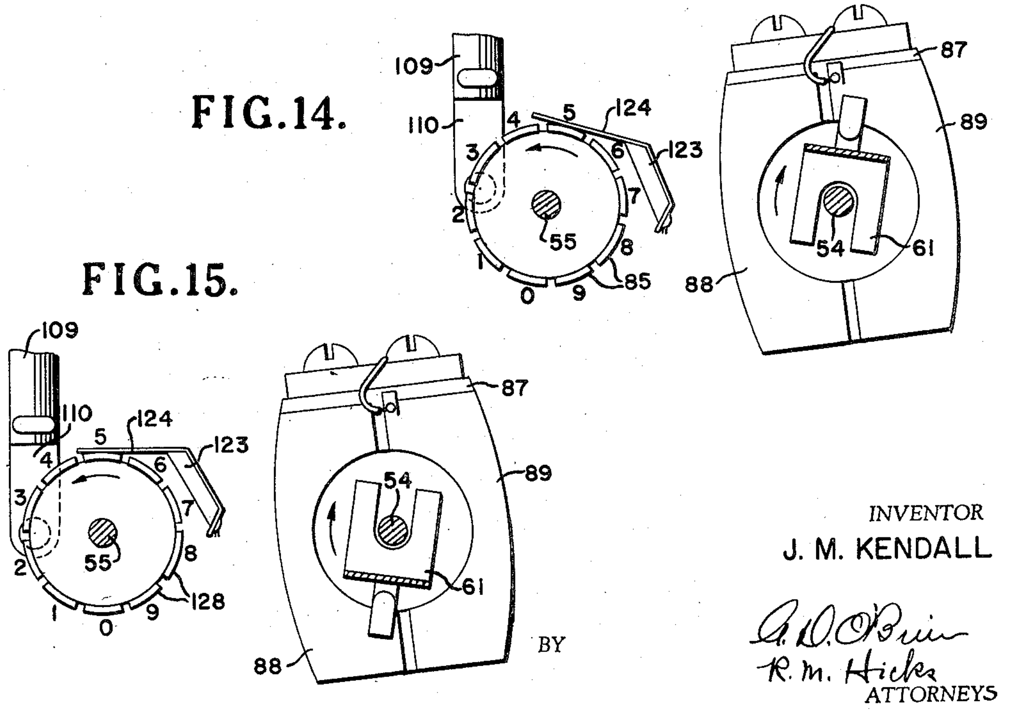
Figs. 14 and 15 are similar views showing the positions of the angularly shiftable commutator contacts and the energizing contacts therefor of the other two decade devices.

Solenoids 108, 131 and 132 operate mechanisms having much the same effect as that operated by solenoid 76. Solenoid 108 is energized only when brush 61 of device 44 is stopped in contact with contact face 89, contact 88 being a dummy contact. As shaft 48 rotates brush 61 at a ten to one ratio with respect to brush 62 of shaft 54, brush 61 of shaft 48 is set to engage dummy contact 88 during the first half of a revolution of shaft 48, or while brush 62 engages "0" through "4" of segments 85 of device 44. Brush 61 engages contact 89 during the last half of a revolution of shaft 48 or while brush 62 engages "5" through "9" of segments 85 of device 44. When contact 89 is engaged, solenoid 108 is energized to rotate segments 85 of device 45 a distance of fifteen degrees. While shaft 48 rotates one revolution, shaft 54 rotates 1/10 of a revolution, as aforesaid, or approximately the width of one segment 85 thereon, thus it is assured that brush 62 of device 45 engages the correct segment although the segment has moved, at any time during the full revolution of shaft 48 and the 1/10 revolution of shaft 54, as clearly shown in Figs. 12 and 13, the direction of rotation of the shafts being shown by arrows.

The operation of brush 61 to engage contacts 88 and 89 of shaft 54 is timed to energize contact 89 during the first half of a revolution or from "0" through "4" positions of the shaft and to engage dummy contact 88 during the last half of a revolution or from "5" through "9" positions of brush 62 of shaft 54, thus to pass current to solenoid 131 of device 45 which rotates segments 128 fifteen degrees during the first half of the revolution of shaft 54. It will be noted that shafts 48, 54, 55 and 56 rotate in alternately opposite directions, in other words, where shaft 48 rotates clockwise, shaft 54 rotates counter-clockwise, shaft 55 rotates clockwise and shaft 56 rotates counter-clockwise. Thus in order to align the brushes with the commutator segments, in each case, the solenoids are energized to advance the segments of the next adjacent decade device rotationally fifteen degrees during the first half of a revolution of shaft 48, during the second half of a revolution of shaft 54, during the first half of a revolution of shaft 55 and during the second half of a revolution of shaft 56. In this manner the segments are maintained in proper relation with the brush associated therewith during the rotation of the brush in order that the proper numerical value is punched in the data tabulator 154.

Each numeral or divisional element of dial 105 is indicative of $\frac{1}{10}$ of a revolution of screw shaft 28, the numerals of dial 98 are indicative of one-hundredth of a revolution of shaft 28, the numerals of dial 106 are indicative of one revolution of shaft 28 and the numerals of dial 107 are indicative of ten revolutions of shaft 28.

The brushes of devices 44 and 45 are free of the contacts thereof during rotation of the brushes in order to relieve friction in the devices wherein the shafts rotate at high speeds during adjustment thereof thus reducing friction therein to a low level, the friction of the slower turning brushes being negligible. Thus the device may be driven by a synchro motor having low torque, in certain applications of the digital converter of the present invention.

Obviously many modifications and variations of the present invention are possible in the light of the above teachings. It is therefore to be understood that within the scope of the appended claims the invention may be practiced otherwise than as specifically described.

What is claimed as new and desired to be secured by Letters Patent of the United States is:

1. Apparatus for converting measurements indicated by rotations of a driven shaft into numerical values comprising, in combination, a plurality of shafts mounted for rotation, one of said shafts being connected to said driven shaft for rotation thereby, 10 to 1 ratio driving means forming a continuous train and connecting each of said shafts with the next adjacent of said shafts whereby the shafts are rotated successively at one tenth of the speed of the next adjacent shaft from one end of the train to the other end thereof, a decade commutator for each of said shafts, a brush for each of said commutators supported for rotation by the respective shafts thereof, means for maintaining the brushes of the higher speed shafts out of contact with the commutators thereof during the rotation of said higher speed shafts, the brushes of the lower speed shafts remaining at all times in contact with the commutators thereof, means for locking the highest speed one of said shafts against rotation thereby to lock all of the shafts through the driving means, and movable means for engaging the higher speed brushes with the associated commutators and for closing a circuit in consecutive order through each of the brushes and the contacts of the commutators associated therewith and engaged by the brushes when the shafts have been locked against rotation whereby the position of each brush may be electrically recorded to indicate the rotative position of the driven shaft, said last-named means including a movable contact ring mounted adjacent each of said higher speed brushes respectively, means for moving said contact ring for engaging and moving said higher speed brushes into engagement their respective commutators and said means for locking the highest speed shaft comprising a disc fixed to said highest speed shaft and rotatable therewith, said disc having a plurality of spaced bores therein equal in number to the contacts of the commutator of the highest speed shaft, and a locking and indexing pin carried by said movable means and movable therewith, movement of said last-named means for moving the contact ring toward the commutator of the highest speed shaft also moving said pin into one of said bores to lock the shaft against rotation and to index the brushes into proper contact relation with their respective commutators.

2. Digital converter apparatus of the character described for indicating measurement by numerical values comprising, means including a first rotational shaft for converting said measurements into shaft rotations, a plurality of rotatable circuit selector means having 10 to 1 ratio driving means interconnecting each one of said selector means with the next adjacent selector means in a decaded arrangement, one of said circuit selector means being driven directly by said first rotational shaft, each of said circuit selector means comprising a decade commutator having a plurality of spaced commutator contacts, each of said contacts being indicative of a digit adapted to be employed in a numerical value, brush means individual to each of the commutators and rotatable with the associated circuit selector means, each of said brush means being adapted to sweep rotationally the contacts of the associated commutator in seriate order as the driving means rotates and after rotation to be positioned in an instant setting with respect to said contacts which corresponds to the instant measurement being taken, means including commutator shifting means responsive to the angular position of the immediately preceding decade commutator for processing the commutator during a preselected half-cycle of rotation of said brush means thereby to maintain a particular contact in proper contact relation with respect to the brush means thereof, a recorder mechanism, a plurality of operating circuits for said recorder mechanism, each of said circuits being connected to one of said commutator contacts of each circuit selector means, means for energizing each of said brush means in consecutive order whereby the instant setting of each brush means with respect to the contacts thereof is recorded in the recorder, means for maintaining at least the brush means associated with the first and second selector means out of engagement with the commutators thereof during rotation thereof, movable means providing for engagement of each of said last-named brush means with one each of said contacts irrespective of the rotational position of the last-named brush means when the shafts have stopped rotating and said circuits are energized, and means for locking the higher speed one of said shafts against rotation thereby to lock all the shafts against rotation through the driving means, said last-named means including a disc fixed to said one shaft and rotatable therewith, said disc having a plurality of spaced bores therein equal in number to the contacts of the commutator of said one shaft and indexed with respect thereto, and a locking and indexing pin carried by said movable means and movable therewith, movement of said movable means also moving said pin into one of said bores to lock said one shaft against rotation and to index said last-named brush means into proper contact relation with the commutator thereof.

3. In an apparatus for converting measurements indicated by rotations of a rotatable member into numerical values and including a plurality of shafts mounted for rotation and interconnected by ratio driving means whereby each of the shafts is rotated at a different speed, the combination of circuit selector means associated with at least one of the high speed shafts of the apparatus and comprising resilient brush means carried by said one shaft and rotatable therewith, a commutator having a plurality of spaced contacts mounted adjacent said brush means to one side thereof, circuit means individually connected to each of said contacts, movable supporting means mounting a contact ring adjacent said brush means to the other side thereof, a conductor connected to said ring, and means for moving said supporting means and ring toward the commutator, such movement engaging the ring with the brush means and moving the brush means into engagement with one of the contacts of the commutator.

4. In an apparatus for converting measurements indicated by rotation of a rotatable member into numerical values and including a plurality of shafts mounted for rotation and interconnected by ratio driving means whereby each of the shafts is rotated at a different speed, the combination of circuit selector means associated with at least one of the higher speed shafts of the apparatus and comprising resilient brush means carried by said one shaft and rotatable therewith, a commutator having a plurality of spaced contacts mounted adjacent said brush means to one side thereof, circuit means individually connected to each of said contacts, movable supporting means mounting a contact ring adjacent said brush means to the other side thereof, a conductor connected to said ring, and means for moving said supporting means and ring toward the commutator, such movement engaging the ring with the brush means and moving the brush means into engagement with one of the contacts of the commutator, a disc fixed to said one shaft and rotatable therewith, said disc having a plurality of spaced bores therein equal in number to the contacts of the commutator and indexed with respect thereto, and a locking and indexing pin carried by said movable supporting means and movable therewith, movement of said last-named means for moving the ring toward the commutator also moving said pin into one of said bores to lock said shaft against rotation and to index said brush means into proper contact relation with said one contact.

5. Digital converter apparatus for indicating measurements by numerical values comprising, in combination, means including a first rotatable shaft for converting said measurements into shaft rotations, a plurality of circuit selector means arranged in spaced adjacency, a plurality of 10 to 1 ratio driving means each interconnecting each of said selector means respectively with the next adjacent selector means, one of said selector means being driven directly by said first rotatable shaft, a plurality of commutators each having a plurality of spaced commutator contacts each corresponding to a different digit and there being one commutator for each of said selector means, a plurality of shafts with a shaft for each of the selector means and rotated by the driving means, each of said contacts being indicative of a digit adapted to be employed in a numerical value, a plurality of brush means with one each fixedly mounted on each of said selector means shafts and rotatable therewith, each of said brush means being adapted to rotationally sweep the contacts of its associated commutator in seriate order as the selector means shafts are rotated by said first rotatable shaft and after rotation to be positioned in an instant setting with respect to said contacts which correspond to the instant measurement being taken, a recorder mechanism, a plurality of operating circuits interconnecting the commutator contacts of each selector means with said recorder mechanism, means for energizing each of said brush means in consecutive order whereby the instant setting of each of the brush means with respect to the contacts thereof is recorded, resilient means for normally holding disengaged at least the first and second of said brush means corresponding to the first and second selector means from the contacts thereof during the rotation of said shafts, means for engaging said first and second brush means with the contacts thereof only when the shafts have stopped rotating and said circuits are energized, said last-named means including a movable contact ring mounted adjacent each of said first and second brush means respectively, means for moving said contact rings and engaging the rings with said resilient means for moving said last-named brush means into engagement with their respective commutators, and means energized when said circuits are energized for rotating the succeeding commutators through an angle greater than the angle of spacing between adjacent contacts as required by said rotational position of the sequentially proceeding brush sufficiently to maintain a particular contact in proper contact relation with respect to the brush means thereof.

6. Digital converter apparatus for indicating measurements by numerical values comprising, in combination, means including a first rotatable shaft for converting said measurements into shaft rotation, a plurality of rotatable circuit selector means having ten to 1 ratio driving means interconnecting each of said selector means with the next adjacent selector means, one of said circuit selector means being driven directly by said first rotatable shaft, each of said circuit selector means comprising a commutator having a plurality of commutator contacts, each of said contacts being indicative of a digit adapted to be employed in a numerical value, brush means individual to each of the commutator and rotatable with the associated circuit selector means, each of said brush means being adapted to sweep rotationally the contacts of the associated commutator in seriate order as the driving means rotates and after rotation to be positioned in an instant setting with respect to said contacts which corresponds to the instant measurement being taken, a recorder mechanism, a plurality of operating circuits for said recorder mechanism, each of said circuits being connected to one of said commutator contacts of each circuit selector means, means for energizing each of said brush means in consecutive order whereby the instant setting of each brush means with respect to the contacts thereof is recorded in the recorder mechanism, resilient means for maintaining at least the brush means associated with the first and second circuit selector means out of engagement with their respective commutators during rotation thereof, and means providing for engagement of each of said last-named brush means with one each of said contacts when the last-named brush means have stopped rotating and said circuits are energized, said means providing for engagement of each of said last-named brush means including a movable contact ring mounted adjacent each of said last named brush means respectively, means for moving said contact rings for engaging said rings with said resilient means and moving said last-named brush means into engagement with their respective commutator contacts.

References Cited in the file of this patent

UNITED STATES PATENTS

| | | |
|---|---|---|
| 835,840 | Strassweg | Nov. 13, 1906 |
| 2,101,452 | Rauch | Dec. 7, 1937 |
| 2,411,513 | Bergier et al. | Nov. 26, 1946 |
| 2,493,709 | Wittennyer | Jan. 6, 1944 |
| 2,577,820 | Singleton | Dec. 11, 1951 |
| 2,620,981 | Benson et al. | Dec. 9, 1952 |
| 2,666,912 | Gow et al. | Jan. 19, 1954 |
| 2,733,008 | D'Andrea et al. | Jan. 31, 1956 |